(12) United States Patent
Tsai

(10) Patent No.: US 7,352,580 B2
(45) Date of Patent: Apr. 1, 2008

(54) CPU COOLER

(75) Inventor: Ming-Kun Tsai, Yunglin Hsien (TW)

(73) Assignee: Hua-Hsin Tsai, Hsinchu County (TW)

( * ) Notice: Subject to any disclaimer, the term of this patent is extended or adjusted under 35 U.S.C. 154(b) by 29 days.

(21) Appl. No.: 11/353,056

(22) Filed: Feb. 14, 2006

(65) Prior Publication Data

US 2007/0188994 A1    Aug. 16, 2007

(51) Int. Cl.
*H05K 7/20* (2006.01)

(52) U.S. Cl. ............... 361/701; 361/700; 361/702; 165/104.29; 165/104.33; 62/259.2

(58) Field of Classification Search ............... 361/687, 361/698, 699, 700, 709–711; 62/259.2; 257/713–715; 174/15.1, 15.2; 165/80.4, 104.21, 104.33, 165/104.26, 185, 104.22, 104.29; 29/890.032
See application file for complete search history.

(56) References Cited

U.S. PATENT DOCUMENTS

| | | | | |
|---|---|---|---|---|
| 4,502,286 A | * | 3/1985 | Okada et al. ............... | 62/119 |
| 4,921,041 A | * | 5/1990 | Akachi ................ | 165/104.29 |
| 5,203,399 A | * | 4/1993 | Koizumi ............... | 165/104.33 |
| 5,329,993 A | * | 7/1994 | Ettehadieh ............ | 165/104.14 |
| 5,953,930 A | * | 9/1999 | Chu et al. ................. | 62/259.2 |
| 5,966,957 A | * | 10/1999 | Malhammar et al. ...... | 62/259.2 |
| 6,269,865 B1 | * | 8/2001 | Huang .................... | 165/104.26 |
| 6,381,135 B1 | * | 4/2002 | Prasher et al. ............. | 361/700 |
| 6,789,611 B1 | * | 9/2004 | Li ......................... | 165/104.29 |
| 6,856,037 B2 | * | 2/2005 | Yazawa et al. ............... | 290/43 |

FOREIGN PATENT DOCUMENTS

JP    08014776 A    *    1/1996
JP    02001066080 A    *    3/2001

* cited by examiner

*Primary Examiner*—Michael Datskovskiy
(74) *Attorney, Agent, or Firm*—Rosenberg, Klein & Lee

(57) ABSTRACT

A CPU cooler includes a heat-conducting unit and a heat-dissipating unit. The heat-conducting unit consists of a heat-conducting block, a heat-conducting piping, an inflow pipe and an outflow pipe. The heat-conducting block is closely positioned on the CPU and the heat-conducting piping is disposed in the heat-conducting block for making liquid to flow therethrough. The heat-conducting piping has its inflow port connected with the inflow pipe and its outflow port connected with the outflow pipe, and the inflow port of the heat-conducting piping is positioned lower than the outflow port. The heat-dissipating unit has one end communicating with the outflow pipe and the other end communicating with the inflow pipe for dissipating the heat and lowering the temperature of the liquid, able to incessantly repeat the cycle of heat dissipation and temperature reduction.

6 Claims, 8 Drawing Sheets

CPU COOLER

BACKGROUND OF THE INVENTION

1. Field of the Invention

This invention relates to a CPU cooler, particularly to one provided with a heat-conducting unit and a heat-dissipating unit. The heat-conducting unit is disposed with a heat conducting piping in the interior for making liquid to flow therethrough. The inflow port of the heat-conducting piping is positioned lower than its outflow port, and the diameter of the inflow pipe of the heat-conducting piping is smaller than that of the outflow pipe. After flowing liquid is heated and vaporized, it will obliquely flow through the heat-conducting piping to be condensed into liquid by the heat-dissipating unit and then flow back to the heat-conducting piping of the heat-conducting unit, having excellent effect of heat dissipation and enabling the CPU of a computer to operate normally and prevent the CPU from being damaged due to high temperature.

2. Description of the Prior Art

Substantially, a CPU is the most important element of a computer. When a computer system is started to operate, the CPU will read the commands and the data of various kinds of software from a memory and, after logic and mathematical operation, it will store the result in the memory and attain the object of data processing through communication of the motherboard and the peripheral devices. Therefore, any work in the interior of the mainframe of a computer cannot be accomplished unless it is processed by the CPU, and the faster the processing speed of the CPU is, the more efficient the computer becomes. But what should not be neglected is the increase of heat energy, and the fact is that the faster the processing speed of the CPU is, the higher the temperature of the CPU becomes. If the temperature of the CPU rises continuously, it will surely influence the processing speed and lower the work efficiency of the CPU and make the computer hang or render the CPU burned down. For dissipating and lowering the high temperature produced by the CPU, the CPU is provided with a cooler for carrying out heat dissipation and temperature reduction.

A conventional cooler 91 for the CPU of a computer is horizontally positioned on the CPU 92, as shown in FIG. 1. The conventional CPU cooler 91 is provided with lots of cooling fins 912 spaced apart equidistantly on a flat plate 911 and has a fan 93 assembled above the cooler 91. Thus, the high temperature produced by the CPU 92 will be conducted to the cooling fins 912 of the cooler 91 through the flat plate 911 and the fan 93 is started to make the surrounding air to produce air convection for dissipating hot air and lowering the temperature so as to prevent the CPU 92 from breaking down due to excessively high temperature and keep the CPU 92 operating normally.

However, the way of starting the fans 93 to produce air convection for dissipating hot air has less effect on heat dissipation especially when the temperature of the surrounding air is too high because air itself is not a good heat-conducting medium. Therefore, many computer users are not satisfied with the heat dissipating effect of the conventional cooler because it is likely to make the computer hang and cause loss of data when the temperature of the CPU rises excessively high and heat dissipation of the CPU is imperfect.

SUMMARY OF THE INVENTION

The objective of the invention is to offer a CPU cooler able to effectively dissipate the heat energy and lower the temperature of the CPU of a computer. The CPU cooler of this invention uses actuating liquid instead of air as a heat-conducting medium for elevating heat dissipating effect to keep low the working temperature of the CPU and insure a computer to work perfectly.

The CPU cooler in the present invention includes a heat-conducting unit and a heat-dissipating unit. The heat-conducting unit consists of a heat-conducting block, a heat-conducting piping, an inflow pipe and an outflow pipe. The heat-conducting block is closely positioned on a CPU and the heat-conducting piping is disposed in the interior of the heat-conducting block for actuating liquid to flow therethrough. The heat-conducting piping has its inflow port connected with the inflow pipe and its outflow port connected with the outflow pipe, and the inflow port is positioned lower than the outflow port. The heat-dissipating unit has one end communicating with the outflow pipe and the other end communicating with the inflow pipe for dissipating the heat and lowering the temperature of the actuating liquid. By so designing, after the actuating liquid flows through the heat-conducting block to be vaporized, the vaporized actuating liquid will obliquely flow through the heat-conducting pipes to be condensed into liquid by the heat-dissipating unit and then flow back to the heat-conducting unit, able to incessantly repeat the cycle of heat dissipating and temperature reduction.

BRIEF DESCRIPTION OF DRAWINGS

This invention will be better understood by referring to the accompanying drawings, wherein.

DETAILED DESCRIPTION OF THE PREFERRED EMBODIMENT

Figure 1:
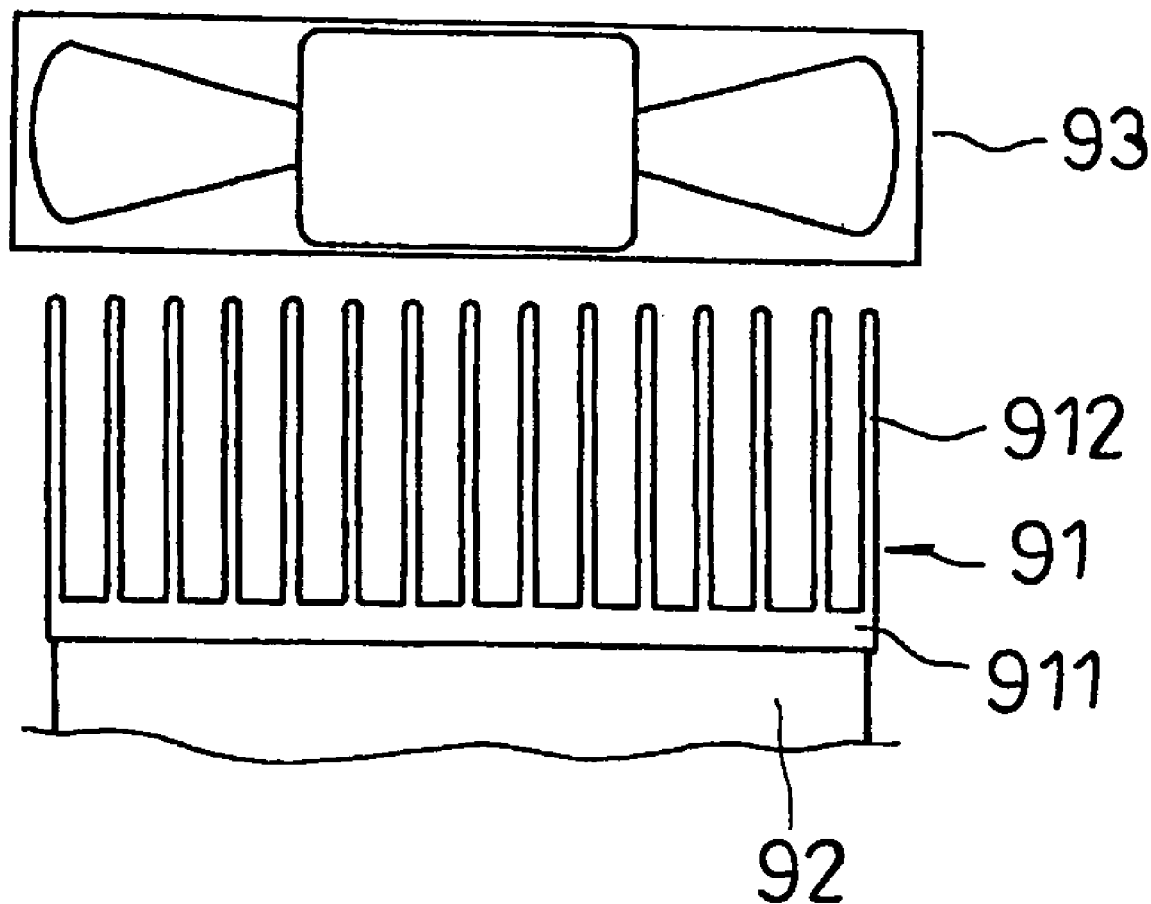
FIG. 1 is a conventional CPU cooler.
Figure 2:
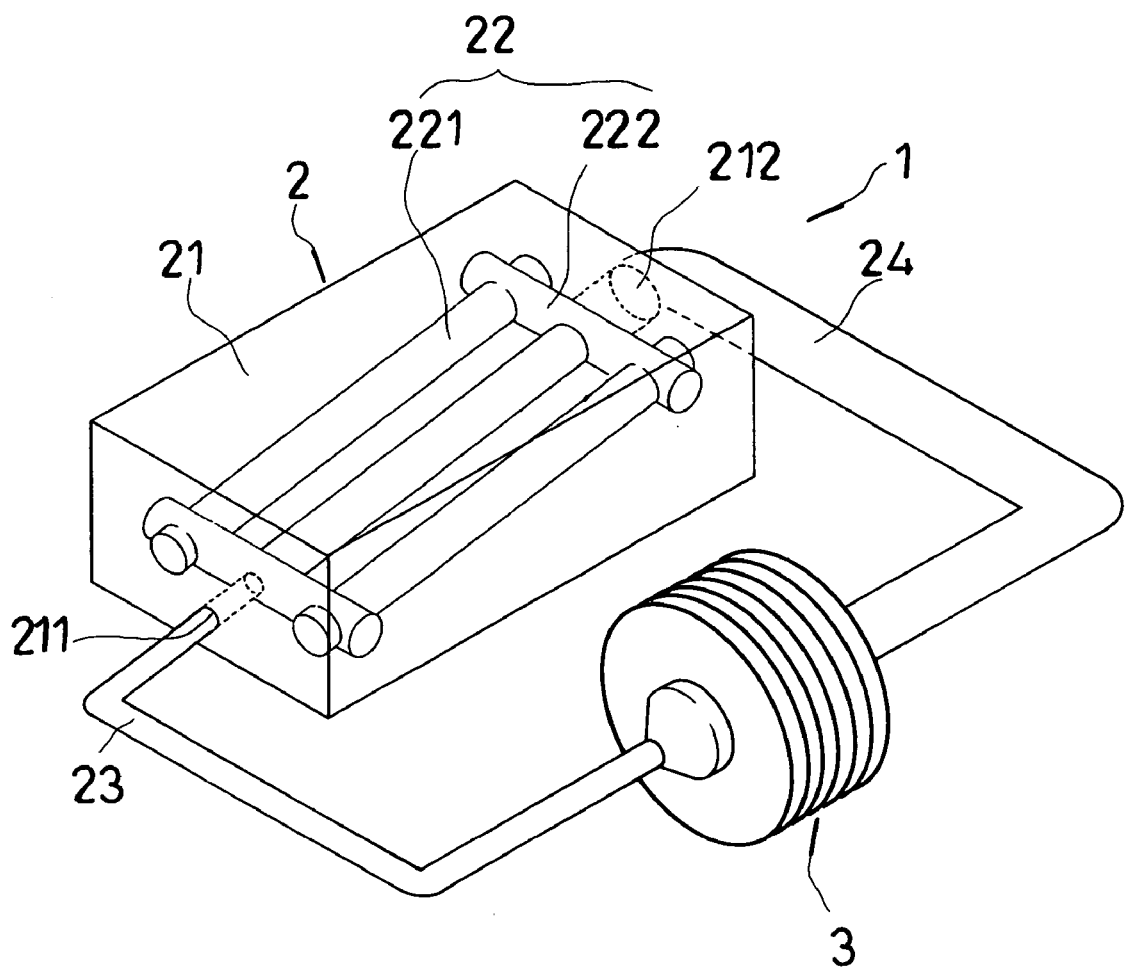
FIG. 2 is a perspective view of a first preferred embodiment of a CPU cooler in the present invention.
Figure 3:
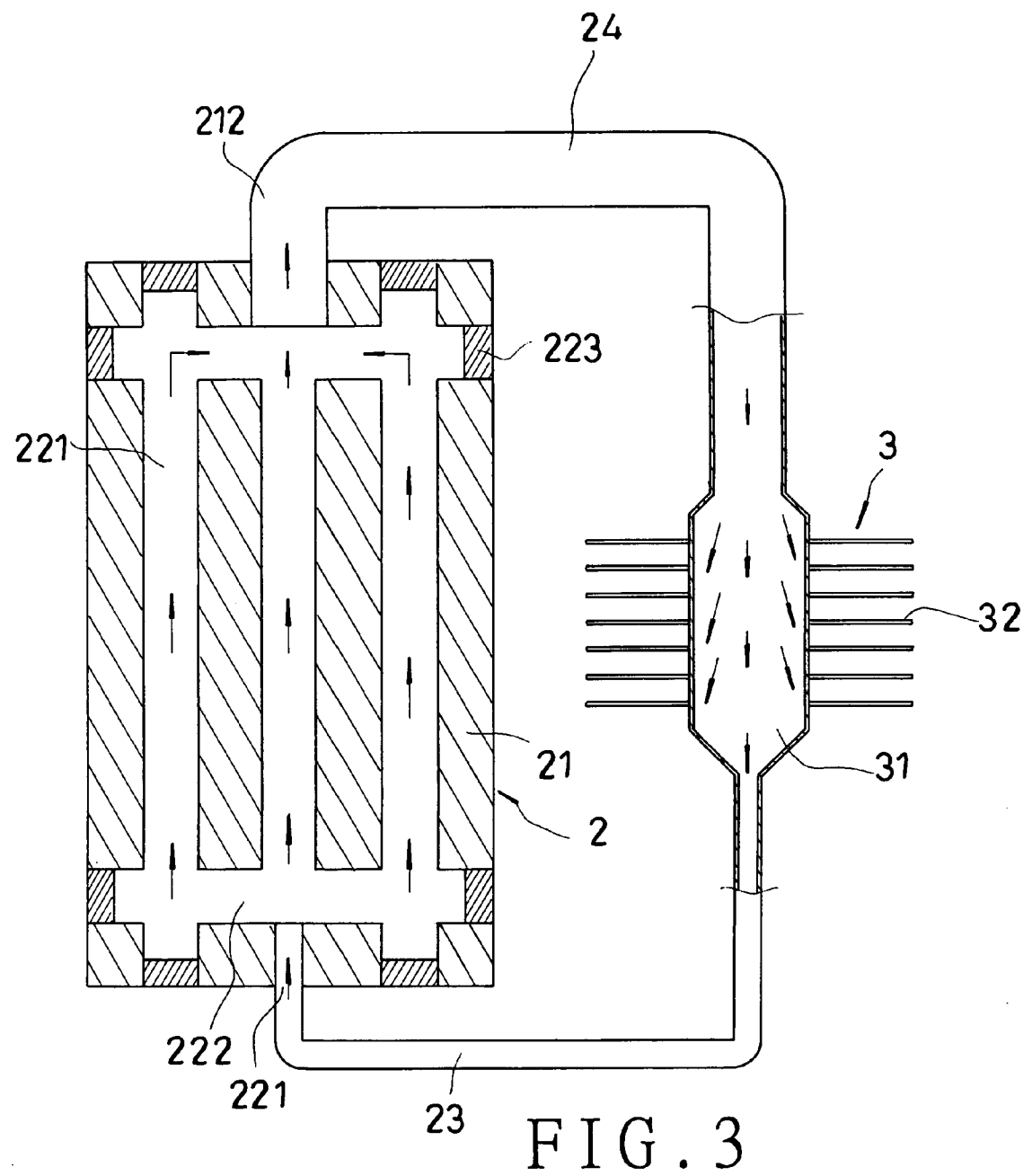
FIG. 3 is a cross-sectional view of the first preferred embodiment of a CPU cooler in the present invention.
Figure 4:
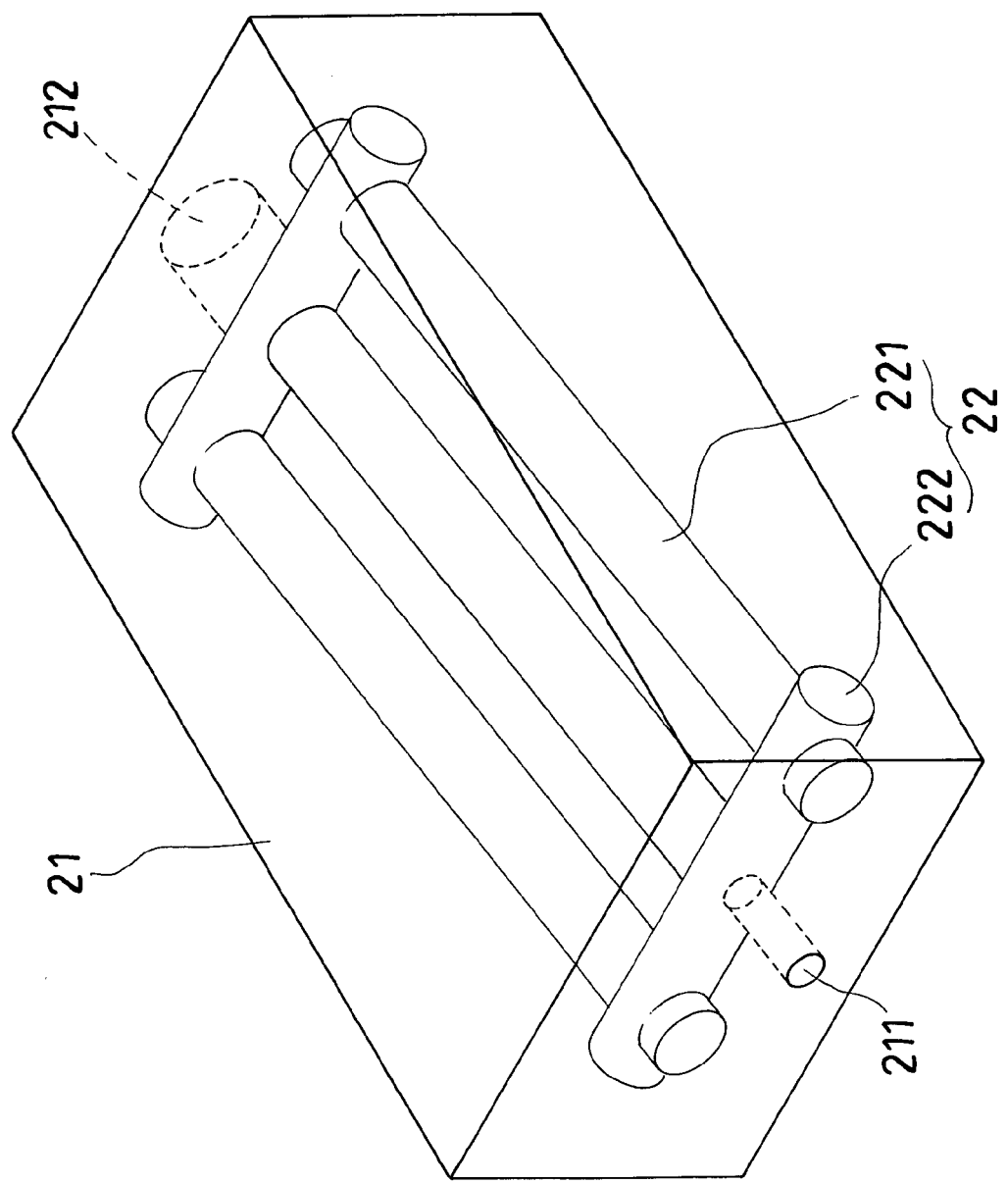
FIG. 4 is a perspective view of the first preferred embodiment of the heat-conducting unit of a CPU cooler in the present invention.

A first preferred embodiment of a CPU cooler 1 in the present invention, as shown in FIGS. 2-4, includes a heat-conducting unit 2 and a heat-dissipating unit 3 combined together.

The heat-conducting unit 2 consists of a heat-conducting block 21, a heat-conducting piping 22, an inflow pipe 23 and an outflow pipe 24. The heat-conducting block 21 is closely positioned on the CPU of a computer and the heat-conducting piping 22 is disposed in the interior of the heat-conducting block 21 for actuating liquid to flow therethrough. The inflow port 211 of the heat-conducting piping 22 is connected with the inflow pipe 23 and its outflow port 212 is connected with the outflow pipe 24. The inflow port 211 of the heat-conducting piping 22 is positioned lower than the outflow port 212, and the diameter of the inflow pipe 23 is smaller than that of the outflow pipe 24.

The heat-conducting piping 22 consists of a plurality of vertical pipes 221 and horizontal pipes 222 crossing and communicating with each other to be filled therein with actuating liquid like refrigerant or any other proper cooling medium. After the actuating liquid is heated and vaporized, the vaporized actuating liquid will expand in volume; therefore, for matching with such changing situation, the diameter of the heat-conducting piping 22 is gradually enlarged from its inflow port 211 to its outflow port 212.

To form the vertical pipes 221 and the horizontal pipes 222 of the heat-conducting piping 22, the heat-conducting block 21 is first bored with vertical and horizontal passageways and then the openings of these passageways are respectively sealed up by a choking member 223 as to seal up as well the heat-conducting piping 22 in the interior of the heat-conducting block 21.

The heat-dissipating unit 3 has one end communicating with the outflow pipe 24 and the other end communicating with the inflow pipe 23 for dissipating the heat and lowering the temperature of the actuating liquid. The heat-dissipating unit 3 consists of a cooling pipe 31 and a plurality of cooling fins 32 spaced apart equidistantly and combined on the circumferential edge of the cooling pipe 31 that is an accommodating chamber having one end connected with the outflow pipe 24 and the other end connected with the inflow pipe 23. The sectional area of the cooling pipe 31 is larger than that of the outflow pipe 24 and of the inflow pipe 23; therefore, after the vaporized liquid flows into the cooling pipe 31 through the outflow pipe 24, the contact area of the vaporized liquid with the cooling fins 32 will be greatly enlarged and the heat energy of the actuating vaporized liquid can be dissipated quickly. When the vapor (the vaporized liquid) cools off to proper temperature, it will be converted into liquid to flow back to the heat-conducting unit 2 through the inflow pipe 23.

By so designing, when the liquid flows into the heat-conducting block 21 through the inflow pipe 23, the high temperature of the CPU will vaporize the liquid into vapor, and then the vapor will pass through the obliquely disposed heat-conducting piping 22 and flow into the outflow pipe 24. The obliquely disposed heat-conducting piping 22 helps the vapor to rise and flow upward. After vaporized, the liquid will expand in volume; therefore, the outflow pipe 24 whose diameter is larger than that of the inflow pipe 23 permits the vapor to pass therethrough smoothly. When the vapor passes through the heat-dissipating unit 3, it will cool off and be condensed into liquid drops, which will adhere to the inner wall of the cooling pipe 31 of the heat-dissipating unit 3 and then gradually fall into the inflow pipe 23 and flow back to the heat-conducting unit 2. Thus, through endless circulation of orderly vaporizing, cooling and condensing, the CPU cooler of this invention can effectively carry out heat dissipation and temperature reduction of the CPU, needless to additionally provide electric power.

Figure 5:
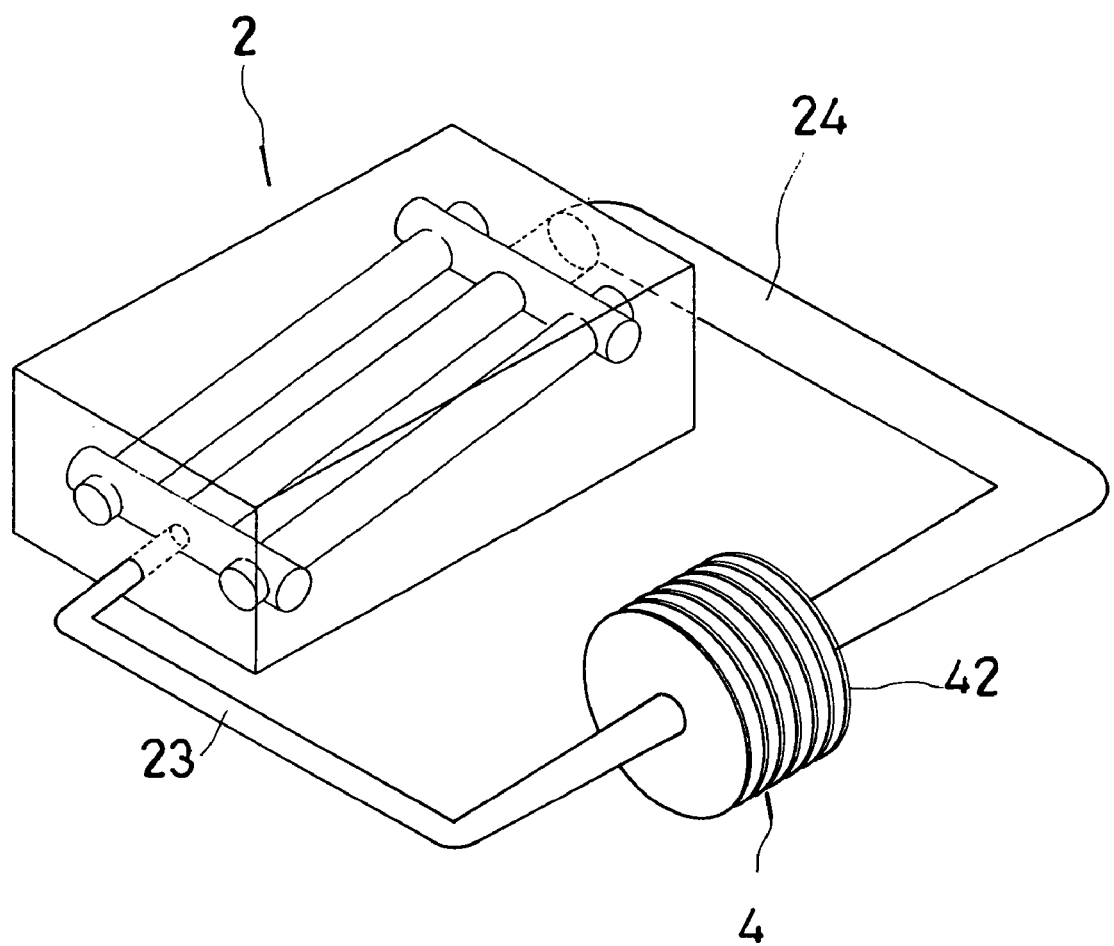
FIG. 5 is a perspective view of a second preferred embodiment of a CPU cooler in the present invention.
Figure 6:
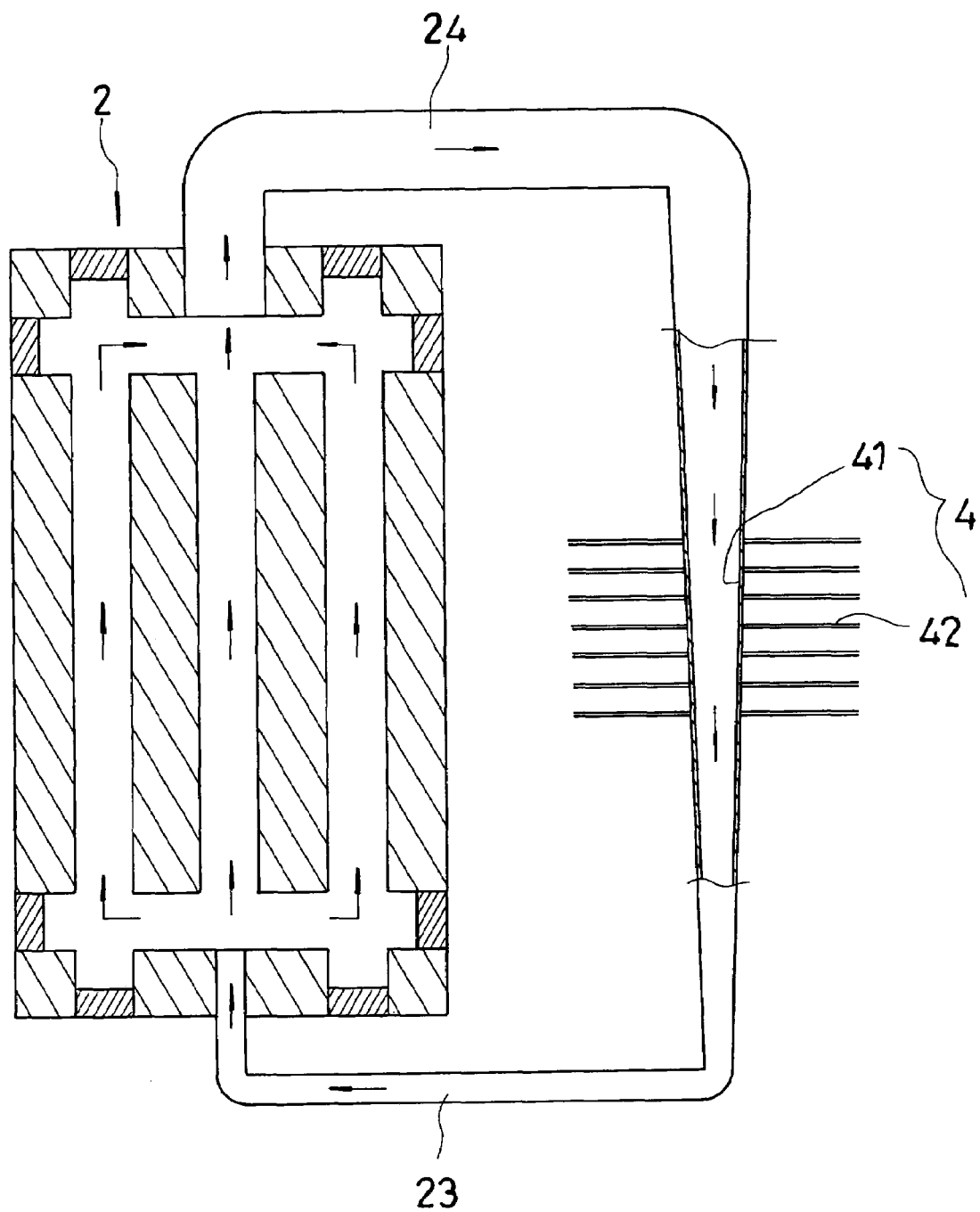
FIG. 6 is a cross-sectional view of the second preferred embodiment of a CPU cooler in the present invention.

A second preferred embodiment of a CPU cooler in the present invention, as shown in FIGS. 5 and 6, includes a heat-conducting unit 2 having the same structure as that described in the first preferred embodiment, and a heat-dissipating unit 4 composed of a cooling pipe 41 and a plurality of cooling fins 42.

The cooling pipe 41 has a conical passageway with one end connected to the outflow pipe 24 and the other end connected to the inflow pipe 23, and has its diameter gradually contracted from the outflow pipe 24 to the inflow pipe 23. The cooling fins 42 spaced apart equidistantly are combined on the circumferential edge of the cooling pipe 41. Thus, when the heat energy of the vaporized actuating liquid is dissipated by the cooling fins 42, the vaporized actuating liquid will cool off and form liquid drops, which will adhere to the inner wall of the cooling pipe 41 and then flow back to the heat-conducting unit 2 through the inflow pipe 23.

Figure 7:
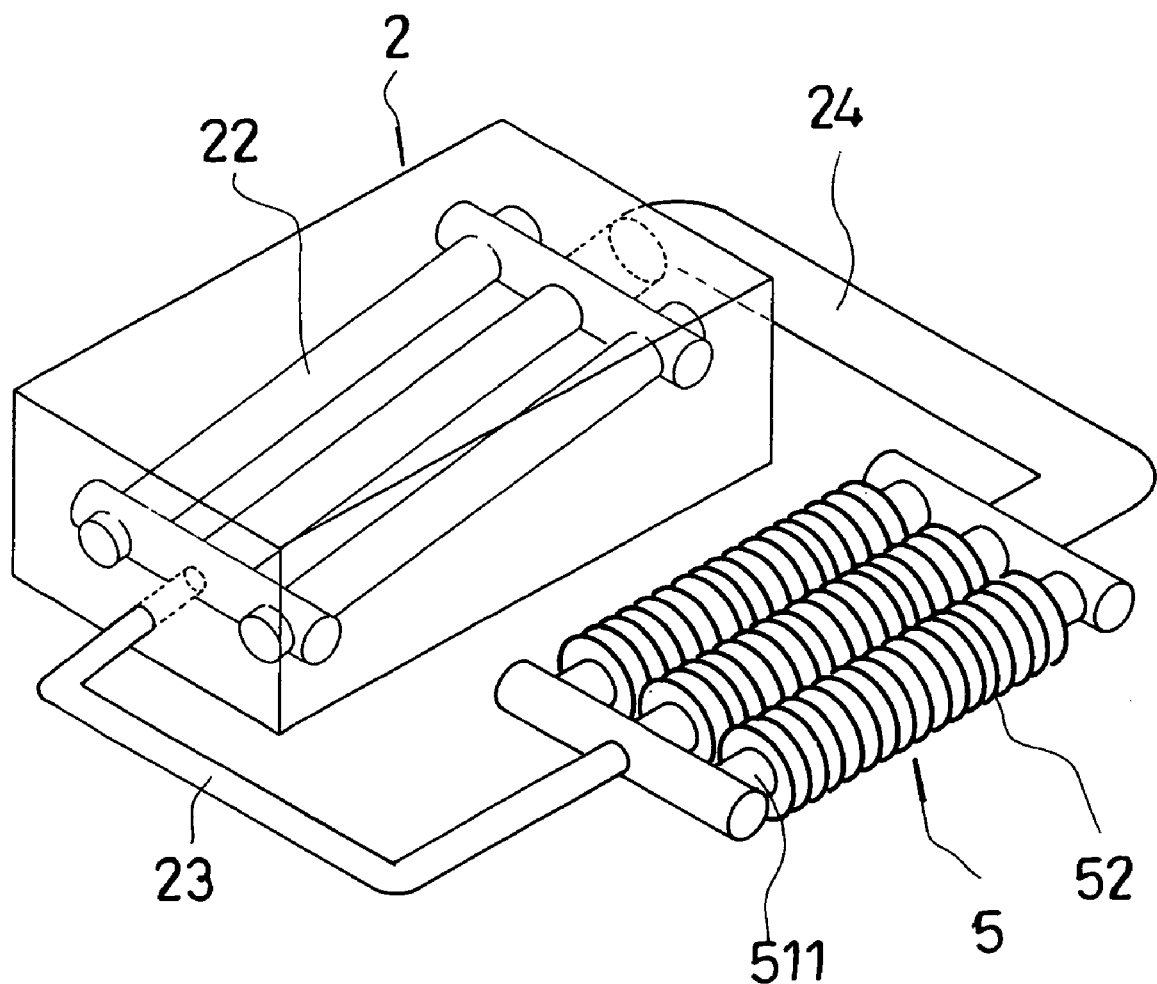
FIG. 7 is a perspective view of a third preferred embodiment of a CPU cooler in the present invention.
Figure 8:
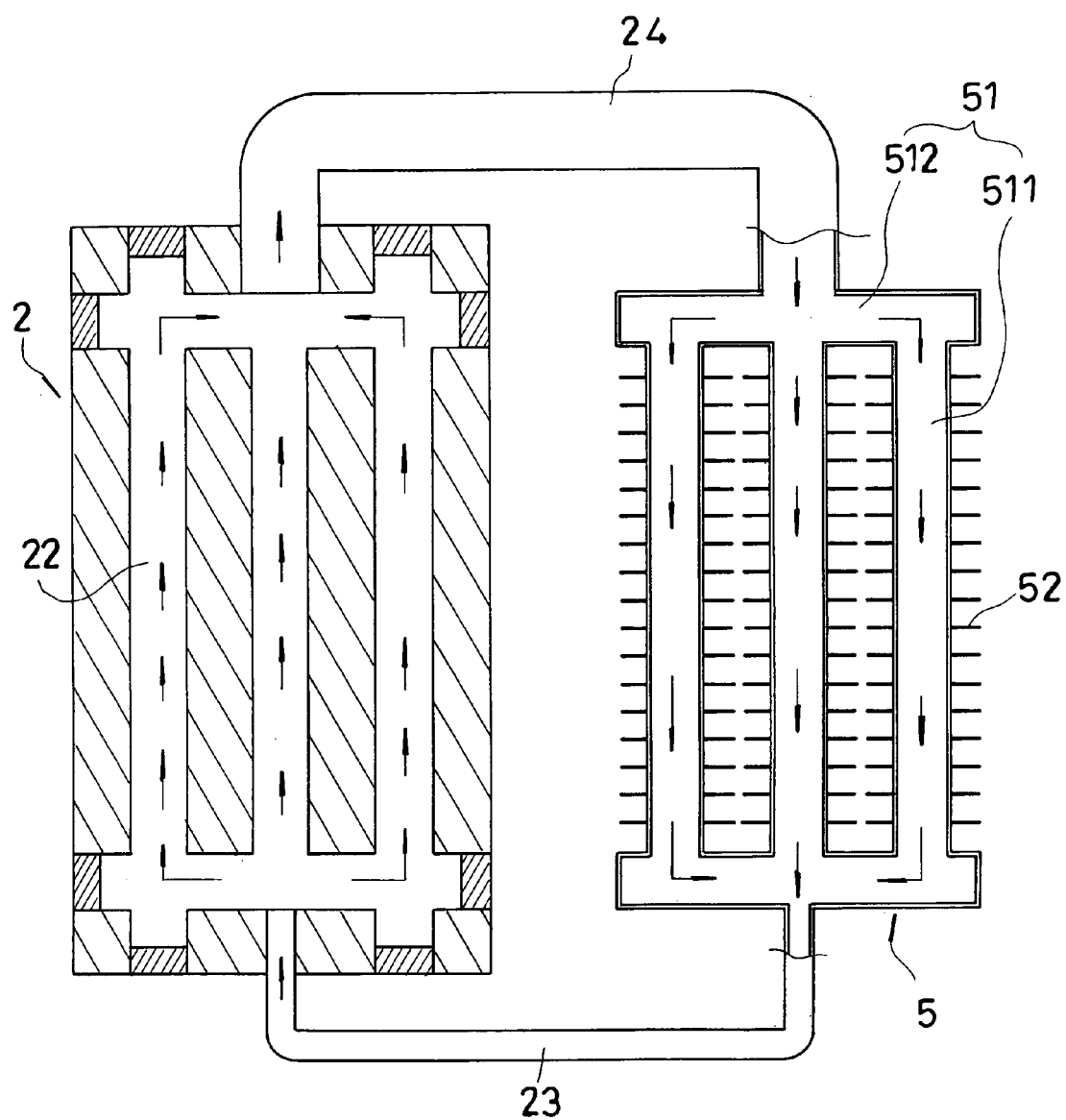
FIG. 8 is a cross-sectional view of the third preferred embodiment of a CPU cooler in the present invention.

A third preferred embodiment of a CPU cooler in the present invention, as shown in FIGS. 7 and 8, includes a heat-conducting unit 2 having the same structure as that described in the first preferred embodiment, and the different point is a heat-dissipating unit 5 composed of a cooling piping 51 and a plurality of cooling fins 52.

The cooling piping 51 consists of a plurality of vertical pipes 511 and horizontal pipes 512 crossing and communicating with each other, just like the arrangement of the heat-conducting pipes 22 of the heat-conducting unit 2. The diameter of the cooling piping 51 is gradually contracted from the outflow pipe 24 to the inflow pipe 23. The cooling fins 52 spaced apart equidistantly are combined on the circumferential edge of the cooling piping 51 for carrying out heat dissipation.

As can be understood from the above description, this invention has the following advantages.

1. The actuating liquid injected in the heat-conducting unit and the heat-dissipating unit has high heat exchange capability; therefore, the heat energy produced by the CPU can be efficiently conducted and dissipated to keep the CPU operating at normal temperature and let the computer work normally. Thus, even under a high-temperature or super-high-frequency working condition, the computer still can work at excellent speeds and with high efficiency.

2. The geometrical structure and disposition of the heat-dissipating unit can efficiently dissipate the heat and lower the temperature of the vapor converted from the liquid to enable the vapor to recover its liquid state and flow back to the heat-conducting piping, able to incessantly repeat the cycle of heat dissipation and needless to additionally supply electric force.

3. The geometrical shape and disposition of the heat-dissipating piping of the heat-dissipating unit can effectively and quickly dissipate the heat energy of the actuating liquid and convert the vaporized actuating liquid into liquid, able to carry out heat dissipation effectively and steadily.

While the preferred embodiments of the invention have been described above, it will be recognized and understood that various modifications may be made therein and the appended claims are intended to cover all such modifications that may fall within the spirit and scope of the invention.

I claim:

1. A CPU cooler comprising a heat-conducting unit and a heat-dissipating unit, said heat-conducting unit composed of a heat-conducting block, a heat-conducting piping, an inflow pipe and an outflow pipe, said heat-conducting piping disposed in the interior of said heat-conducting block for making liquid to flow therethrough, said heat-conducting piping having its inflow port connected with said inflow pipe and its outflow port connected with said outflow pipe, said inflow port positioned lower than said outflow port, said heat-dissipating unit having one end communicating with said outflow pipe and the other end communicating with said inflow pipe, said heat-dissipating unit is composed of a cooling pipe and a plurality of cooling fins, said cooling fins spaced apart equidistantly and combined on the circumferential edge of said cooling piping, said cooling piping of said heat-dissipating unit is an accommodating chamber having one end connected with said outflow pipe and the other end connected with said inflow pipe, and the sectional area of said accommodating chamber is larger than that of said outflow pipe and said inflow pipe, said heat-dissipating unit dissipating the heat and lowering the temperature of said liquid, said liquid flowing through said heat-conducting block to be heated and vaporized, the vapor obliquely flowing through said heat-conducting piping, said vapor then condensed into liquid by said heat-dissipating unit and flowing back to said heat-conducting unit, able to incessantly repeat the cycle of heat dissipation and temperature reduction.

2. The CPU cooler as claimed in claim 1, wherein said heat-conducting piping is composed of a plurality of parallel and perpendicular pipes crossing and communicating with each other for said liquid flow therethrough.

3. The CPU cooler as claimed in claim 2, wherein said vertical and said horizontal pipes are formed by having the openings of the vertical and the horizontal passageways of said heat-conducting block respectively sealed up by a choking member.

4. The CPU cooler as claims in claim 1, wherein the diameter of said inflow pipe is smaller than that of said outflow pipe.

5. A CPU cooler comprising a heat-conducting unit and a heat-dissipating unit, said heat-conducting unit composed of a heat-conducting block, a heat-conducting piping, an inflow pipe and an outflow pipe, said heat-conducting piping disposed in the interior of said heat-conducting block for making liquid to flow therethrough, said heat-conducting piping having its inflow port connected with said inflow pipe and its outflow port connected with said outflow pipe, said inflow port positioned lower than said outflow port, said heat-dissipating unit having one end communicating with said outflow pipe and the other end communicating with said inflow pipe, said heat-dissipating unit dissipating the heat and lowering the temperature of said liquid, said liquid flowing through said heat-conducting block to be heated and vaporized, the vapor obliquely flowing through said heat-conducting piping, said vapor then condensed into liquid by said heat-dissipating unit, said heat-dissipating unit is composed of a cooling pipe and a plurality of cooling fins, said cooling fins spaced apart equidistantly and combined on the circumferential edge of said cooling pipe, said cooling pipe of said heat-dissipating unit has a conical passageway with one end connected to said outflow pipe and the other end connected to said inflow pipe, and flowing back to said heat-conducting unit, able to incessantly repeat the cycle of heat dissipation and temperature reduction.

6. A CPU cooler comprising a heat-conducting unit and a heat-dissipating unit, said heat-conducting unit composed of a heat-conducting block, a heat-conducting piping, an inflow pipe and an outflow pipe, said heat-conducting piping disposed in the interior of said heat-conducting block for making liquid to flow therethrough, said heat-conducting piping having its inflow port connected with said inflow pipe and its outflow port connected with said outflow pipe, said inflow port positioned lower than said outflow port, said heat-dissipating unit having one end communicating with said outflow pipe and the other end communicating with said inflow pipe, said heat-dissipating unit is composed of a cooling pipe and a plurality of cooling fins, said cooling fins spaced apart equidistantly and combined on the circumferential edge of said cooling piping, said heat-dissipating unit dissipating the heat and lowering the temperature of said liquid, said heat-dissipating piping of said heat-dissipating unit is composed of a plurality of parallel and perpendicular pipes crossing and communicating with each other, and the diameter of said cooling pipe is gradually contracted from said outflow pipe to said inflow pipe said liquid flowing through said heat-conducting block to be heated and vaporized, the vapor obliquely flowing through said heat-conducting piping, said vapor then condensed into liquid by said heat-dissipating unit and flowing back to said heat-conducting unit, able to incessantly repeat the cycle of heat dissipation and temperature reduction.

* * * * *